(12) United States Patent
Kuramoto et al.

(10) Patent No.: US 12,266,906 B2
(45) Date of Patent: Apr. 1, 2025

(54) VERTICAL CAVITY SURFACE EMITTING DEVICE

(71) Applicant: STANLEY ELECTRIC CO., LTD., Tokyo (JP)

(72) Inventors: Masaru Kuramoto, Tokyo (JP); Seiichiro Kobayashi, Tokyo (JP)

(73) Assignee: STANLEY ELECTRIC CO., LTD., Tokyo (JP)

( * ) Notice: Subject to any disclaimer, the term of this patent is extended or adjusted under 35 U.S.C. 154(b) by 769 days.

(21) Appl. No.: 17/432,466

(22) PCT Filed: Jan. 20, 2020

(86) PCT No.: PCT/JP2020/001693
§ 371 (c)(1),
(2) Date: Aug. 19, 2021

(87) PCT Pub. No.: WO2020/170675
PCT Pub. Date: Aug. 27, 2020

(65) Prior Publication Data
US 2022/0149595 A1    May 12, 2022

(30) Foreign Application Priority Data

Feb. 21, 2019   (JP) .................. 2019-029293

(51) Int. Cl.
*H01S 5/183* (2006.01)
(52) U.S. Cl.
CPC ............................ *H01S 5/18361* (2013.01)
(58) Field of Classification Search
CPC .................................................. H01S 5/18369
See application file for complete search history.

(56) References Cited

U.S. PATENT DOCUMENTS 6,751,245 B1    6/2004  Wasserbauer et al.
6,845,118 B1 *  1/2005  Scott ................... H01S 5/02251
                                                    257/E33.059

(Continued)

FOREIGN PATENT DOCUMENTS

CN    101432936 A    5/2009
CN    101765951 A    6/2010

(Continued)

OTHER PUBLICATIONS

Chinese Office Action (and an English language translation thereof) dated Jan. 29, 2024, issued in counterpart Chinese Application No. 202080015818.4.

(Continued)

*Primary Examiner* — Minsun O Harvey
*Assistant Examiner* — Stephen Sutton Kotter
(74) *Attorney, Agent, or Firm* — Holtz, Holtz & Volek PC

(57) ABSTRACT

A vertical cavity surface emitting device includes a substrate, a first multilayer film reflecting mirror, a light-emitting structure layer with a light-emitting layer, and a second multilayer film reflecting mirror. The second multilayer film reflecting mirror constitutes a resonator between the first and second multilayer film reflecting mirrors. The second multilayer film reflecting mirror includes a first multilayer film, an intermediate film, and a second multilayer film. The first and second multilayer films have low refractive index films and high refractive index films that are alternately stacked. The intermediate film covers an upper surface of the first multilayer film and film has a translucency to a light emitted from the light-emitting layer. The second multilayer film partially covers an upper surface of the intermediate film. The intermediate film has a film thickness based on ½ of a wavelength inside the intermediate film of light emitted from the light-emitting layer.

10 Claims, 11 Drawing Sheets

(56) References Cited

U.S. PATENT DOCUMENTS

| | | | |
|---|---|---|---|
| 7,346,090 B2 | 3/2008 | Johnson et al. | |
| 7,856,041 B2 | 12/2010 | Johnson | |
| 8,208,511 B2 | 6/2012 | Sato et al. | |
| 8,254,424 B2 | 8/2012 | Johnson | |
| 8,451,875 B2 | 5/2013 | Johnson | |
| 9,935,427 B2 | 4/2018 | Tazawa et al. | |
| 9,972,972 B2 | 5/2018 | Tazawa et al. | |
| 10,381,804 B2 | 8/2019 | Tazawa et al. | |
| 10,483,721 B2 | 11/2019 | Tazawa et al. | |
| 2002/0085610 A1 | 7/2002 | Morgan et al. | |
| 2004/0233963 A1* | 11/2004 | Hooper | H01S 5/18344 372/99 |
| 2008/0179605 A1 | 7/2008 | Takase et al. | |
| 2010/0027578 A1* | 2/2010 | Takeuchi | B82Y 20/00 372/99 |
| 2012/0307855 A1* | 12/2012 | Chitica | H01S 5/18327 372/45.01 |
| 2014/0044438 A1 | 2/2014 | Takeda et al. | |
| 2015/0380903 A1 | 12/2015 | Nagatomo | |
| 2016/0134083 A1 | 5/2016 | Dallesasse et al. | |
| 2017/0214218 A1 | 7/2017 | Tan et al. | |
| 2019/0115722 A1* | 4/2019 | Sorin | H01S 5/18333 |
| 2019/0363515 A1 | 11/2019 | Kuramoto et al. | |

FOREIGN PATENT DOCUMENTS

| | | | |
|---|---|---|---|
| JP | 2000294873 A | 10/2000 | |
| JP | 2003298186 A | 10/2003 | |
| JP | 2005353623 A | 12/2005 | |
| JP | 2014036027 A | 2/2014 | |
| JP | 5707742 B2 | 4/2015 | |
| JP | 2016004944 A | 1/2016 | |
| JP | 2016103630 A | 6/2016 | |
| JP | 2017204579 A | 11/2017 | |

OTHER PUBLICATIONS

U.S. Appl. No. 17/285,635, First Named Inventor: Masaru Kuramoto; Title: "Vertical Cavity Surface Emitting Device"; Filed: Apr. 15, 2021.

U.S. Appl. No. 17/285,859, First Named Inventor: Masaru Kuramoto; Title: "Vertical Cavity Surface Emitting Device"; filed Apr. 15, 2021.

U.S. Appl. No. 17/432,470, First Named Inventor: Masaru Kuramoto; Title: "Vertical Cavity Surface Emitting Device"; filed Aug. 19, 2021.

International Search Report (ISR) (and English translation thereof) dated Mar. 31, 2020 issued in International Application No. PCT/JP2020/001693.

Written Opinion dated Mar. 31, 2020 issued in International Application No. PCT/JP2020/001693.

Extended European Search Report (EESR) dated Nov. 18, 2022, issued in counterpart European Application No. 20759298.1.

Japanese Office Action (and English language translation thereof) dated Oct. 18, 2022, issued in counterpart Japanese Application No. 2019-029293.

* cited by examiner

VERTICAL CAVITY SURFACE EMITTING DEVICE

TECHNICAL FIELD

The present invention relates to a vertical cavity surface emitting device, such as a vertical cavity surface emitting laser.

BACKGROUND ART

The vertical cavity surface emitting laser (hereinafter simply referred to as a surface emitting laser) is a semiconductor laser that includes reflecting mirrors formed of multilayer films stacked on a substrate and emits a light in a direction perpendicular to a surface of the substrate. For example. Patent Document 1 discloses a surface emitting laser using a nitride semiconductor.
Patent Document 1: Japanese Patent No. 5707742

DISCLOSURE OF THE INVENTION

Problems to be Solved by the Invention

For example, in the vertical cavity surface emitting device, such as the surface emitting laser, it is preferred that a light emission pattern is stable, for example, a far-field pattern is stable. Accordingly, for example, a resonator configured to generate a light in a desired transverse mode is preferably configured in the vertical cavity surface emitting device. For example, generating a laser beam in a fundamental eigenmode allows obtaining a far-field pattern of unimodal laser beam having a low emission angle and a high-output power.

The present invention has been made in consideration of the above-described points and an object of which is to provide a vertical cavity surface emitting device that allows emitting a light in a stable transverse mode.

Solutions to the Problems

A vertical cavity surface emitting device according to the present invention includes a substrate, a first multilayer film reflecting mirror, a light-emitting structure layer, and a second multilayer film reflecting mirror. The first multilayer film reflecting mirror is formed on the substrate. The light-emitting structure layer is formed on the first multilayer film reflecting mirror. The light-emitting structure layer includes a light-emitting layer. The second multilayer film reflecting mirror is formed on the light-emitting structure layer. The second multilayer film reflecting mirror constitutes a resonator between the first multilayer film reflecting mirror and the second multilayer film reflecting mirror. The second multilayer film reflecting mirror includes a first multilayer film, an intermediate film, and a second multilayer film. The first multilayer film has low refractive index films made of a low refractive index material and high refractive index films made of a high refractive index material having a refractive index higher than a refractive index of the low refractive index material. The low refractive index films and the high refractive index films are alternately stacked. The intermediate film covers an upper surface of the first multilayer film. The intermediate film has a translucency to a light emitted from the light-emitting layer. The second multilayer film is formed to partially cover an upper surface of the intermediate film. The second multilayer film has low refractive index films made of the low refractive index material and high refractive index films made of the high refractive index material. The low refractive index films and the high refractive index films are alternately stacked. The intermediate film has a film thickness based on ½ of a wavelength inside the intermediate film of a light emitted from the light-emitting layer.

DESCRIPTION OF PREFERRED EMBODIMENTS

The following will describe embodiments of the present invention in detail. In the following embodiments, a case where the present invention is embodied as a surface emitting laser (semiconductor laser) will be described. However, the present invention is not limited to the surface emitting laser but applicable to various kinds of vertical cavity surface emitting devices, such as a vertical cavity surface emitting diode.

Embodiment 1

Figure 1:
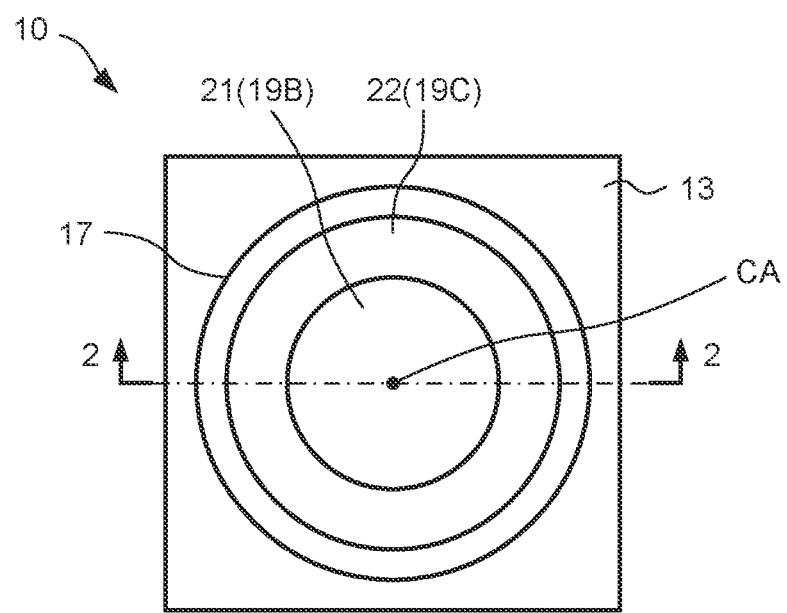
FIG. 1 is a top view of a surface emitting laser according to Embodiment 1.
Figure 2:
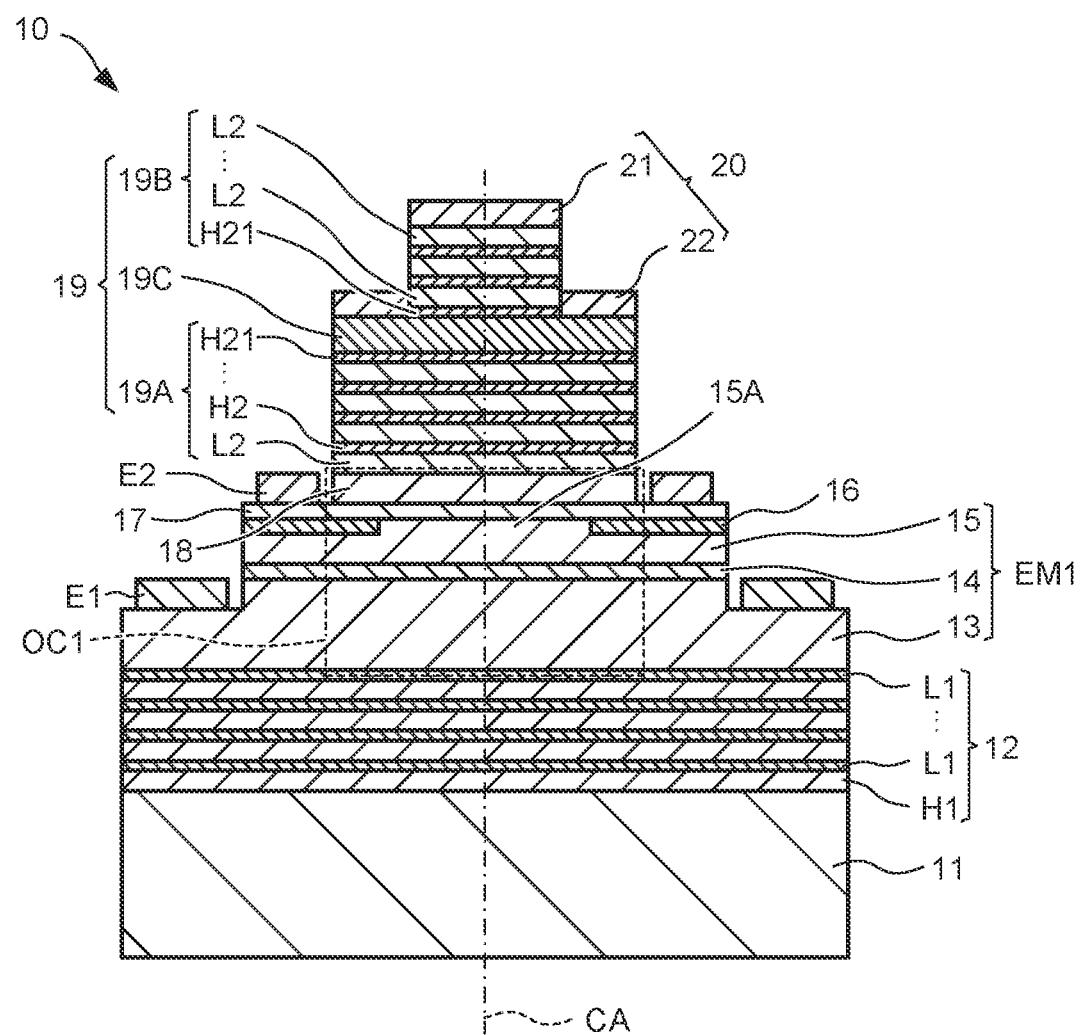
FIG. 2 is a cross-sectional view of the surface emitting laser according to Embodiment 1.

FIG. 1 is a schematic top view of a Vertical Cavity Surface Emitting Laser (VCSEL, hereinafter referred to as a surface emitting laser) according to Embodiment 1. FIG. 2 is a cross-sectional view of a surface emitting laser 10. FIG. 2 is a cross-sectional view taken along the line 2-2 in FIG. 1. The configuration of the surface emitting laser 10 will be described with reference to FIG. 1 and FIG. 2.

The surface emitting laser 10 includes a substrate 11 and a first multilayer film reflecting mirror (hereinafter simply referred to as a first reflecting mirror) 12 formed on the substrate 11. In this embodiment, the first reflecting mirror 12 is formed on the substrate 11 and has a structure in which first semiconductor films (hereinafter referred to as high refractive index semiconductor films) H1 and second semiconductor films (hereinafter referred to as low refractive index semiconductor films) L1 having a refractive index lower than that of the high refractive index semiconductor films H1 are stacked in alternation. In this embodiment, the first reflecting mirror 12 constitutes a Distributed Bragg Reflector (DBR) made of a semiconductor material.

In this embodiment, the substrate 11 has a composition of GaN. The substrate 11 is a substrate for growth used for crystal growth of the first reflecting mirror 12. The high refractive index semiconductor films H1 in the first reflecting mirror 12 have a composition of GaN, and the low refractive index semiconductor films L1 have a composition of AlInN. In this embodiment, between the substrate 11 and the first reflecting mirror 12, a buffer layer (not illustrated) having a composition of GaN is disposed.

The surface emitting laser 10 includes a light-emitting structure layer EM1 formed on the first reflecting mirror 12 and including a light-emitting layer 14. In this embodiment, the light-emitting structure layer EM1 includes a plurality of semiconductor layers made of a nitride-based semiconductor. The light-emitting structure layer EM1 includes a n-type semiconductor layer (first semiconductor layer) 13 formed on the first reflecting mirror 12, the light-emitting layer (active layer) 14 formed on the n-type semiconductor layer 13, and a p-type semiconductor layer (second semiconductor layer) 15 formed on the light-emitting layer 14.

In this embodiment, the n-type semiconductor layer 13 has a composition of GaN and contains Si as n-type impurities. The light-emitting layer 14 has a quantum well structure that includes a well layer having a composition of InGaN and a barrier layer having a composition of GaN. The p-type semiconductor layer 15 has a GaN-based composition and contains Mg as p-type impurities.

The configuration of the light-emitting structure layer EM1 is not limited to this. For example, the n-type semiconductor layer 13 may include a plurality of n-type semiconductor layers having mutually different compositions. The p-type semiconductor layer 15 may include a plurality of p-type semiconductor layers having mutually different compositions.

For example, the p-type semiconductor layer 15 may include, for example, an AlGaN layer as an electron-blocking layer (not illustrated) that reduces an overflow of electrons implanted into the light-emitting layer 14 to the p-type semiconductor layer 15 at the interface with the light-emitting layer 14. The p-type semiconductor layer 15 may include a contact layer (not illustrated) to form an ohmic contact with an electrode. In this case, for example, the p-type semiconductor layer 15 only needs to include a GaN layer as a cladding layer between the electron-blocking layer and the contact layer.

In this embodiment, the p-type semiconductor layer 15 includes a projection 15A on an upper surface thereof. In this embodiment, the projection 15A has a columnar shape. The surface emission laser 10 has an insulating layer (a first insulating layer) 16 formed on an upper surface thereof other than the projection 15A of the p-type semiconductor layer 15. The insulating layer 16 has translucency to a light emitted from the light-emitting layer 14 and is made of a material having a refractive index lower than that of the p-type semiconductor layer 15 (the projection 15A), for example, an oxide, such as $SiO_2$. A top end surface of the projection 15A of the p-type semiconductor layer 15 is exposed from the insulating layer 16.

The surface emitting laser 10 includes a light-transmitting electrode layer 17 formed on the insulating layer 16 and connected to the p-type semiconductor layer 15 at the projection 15A of the p-type semiconductor layer 15. The light-transmitting electrode layer 17 is a conductive film having translucency to a light emitted from the light-emitting layer 14. The light-transmitting electrode layer 17 is in contact with the upper surface of the insulating layer 16 and the upper end surface of the projection 15A of the p-type semiconductor layer 15. For example, the light-transmitting electrode layer 17 is made of a metal oxide film, such as ITO or IZO.

The insulating layer 16 functions as a current confinement layer that confines a current injected into the light-emitting structure layer EM1 via the light-transmitting electrode layer 17. Specifically, an upper surface region outside the projection 15A in the p-type semiconductor layer 15 functions as high resistance regions having an electrical resistance higher than that of the other regions by being covered with the insulating layer 16. Accordingly, a current path inside the light-emitting structure layer EM1 is confined by a region of the projection 15A of the p-type semiconductor layer 15.

The surface emitting laser 10 includes an insulating layer (second insulating layer) 18 formed on the light-transmitting electrode layer 17. For example, the insulating layer 18 is made of a metal oxide with insulation property, such as $Ta_2O_5$, $Nb_2O_5$, $ZrO_2$, $TiO_2$, and $HfO_2$. The insulating layer 18 has translucency to the light emitted from the light-emitting layer 14.

The surface emitting laser 10 includes a second multilayer film reflecting mirror (hereinafter simply referred to as a second reflecting mirror) 19 formed on the insulating layer 18. The second reflecting mirror 19 is disposed at a position facing the first reflecting mirror 12 with the light-emitting structure layer EM1 interposed therebetween. A resonator OC1 having a direction perpendicular to the light-emitting structure layer EM1 (a direction perpendicular to the substrate 11) as a resonator length direction is constituted between the second reflecting mirror 19 and the first reflecting mirror 12.

In this embodiment, the second reflecting mirror 19 has a structure in which first dielectric films (hereinafter referred to as high refractive index dielectric films) H2 and second dielectric films (hereinafter referred to as low refractive index dielectric films) L2 having a refractive index lower than that of the high refractive index dielectric films H2 are stacked in alternation.

That is, in this embodiment, the second reflecting mirror 19 constitutes the Distributed Bragg Reflector (DBR) made of a dielectric material. For example, in this embodiment, the high refractive index dielectric films H2 are made of a $Nb_2O_5$ film, and the low refractive index dielectric films L2 are made of a $SiO_2$ film.

In this embodiment, the second reflecting mirror 19 has first and second dielectric multilayer films (hereinafter referred to as first and second multilayer films) 19A and 19B each including a plurality of high refractive index dielectric film H2 and low refractive index dielectric film L2 and an intermediate dielectric film (an intermediate film) 19C that is formed between the first and second multilayer films 19A and 19B and has an etching rate smaller than those of, for example, the high refractive index dielectric films H2 and the low refractive index dielectric films L2.

The intermediate dielectric film 19C is, for example, made of an $Al_2O_3$ film and has an etching rate for dry etching of 1/10 or less of those of the $Nb_2O_5$ film and the $SiO_2$ film. Another example of the intermediate dielectric film 19C include an AlN film.

In this embodiment, the intermediate dielectric film 19C is formed between the high refractive index dielectric film H2 within the second reflecting mirror 19. Specifically, in this embodiment, the first multilayer film 19A has a high refractive index dielectric film (hereinafter, a first thin film high refractive index dielectric film) H21 having a film thickness half of that of the high refractive index dielectric films H2 on its upper surface. The intermediate dielectric film 19C is formed on the first thin film high refractive index dielectric film H21. The second multilayer film 19B has the high refractive index dielectric film (a second thin film high refractive index dielectric film) H21 on an interface with the intermediate dielectric film 19C.

The second multilayer film 19B is disposed inside the intermediate dielectric film 19C in an in-plane direction of the intermediate dielectric film 19C. In this embodiment, the first multilayer film 19A and the intermediate dielectric film 19C has the same width. In this embodiment, the first multilayer film 19A and the intermediate dielectric film 19C has a columnar shape having the same diameter.

The second multilayer film 19B has a width smaller than that of the intermediate dielectric film 19C. In this embodiment, the second multilayer film 19B is formed to be coaxial with the first multilayer film 19A and the intermediate dielectric film 19C and has a columnar shape having a diameter smaller than those of the first multilayer film 19A and the intermediate dielectric film 19C.

In this embodiment, as illustrated in FIG. 1, the surface emission laser 10 has the resonator OC1 having a cross-sectional shape that corresponds to a shape of the first multilayer film 19A of the second reflecting mirror 19, in this embodiment, a columnar shape.

The surface emission laser 10 has a metallic film 20 formed on the second reflecting mirror 19. In this embodiment, the metallic film 20 has reflectivity to the light emitted from the light-emitting layer 14. The metallic film 20 includes a first metallic film 21 that covers the upper surface of the second multilayer film 19B and a second metallic film 22 that covers the upper surface region of the intermediate dielectric film 19C that is exposed from the second multilayer film 19B. For example, the metallic film 20 is made of a metallic material, such as Ti, Cr, Ni, Pt, Au, and Sn.

The surface emitting laser 10 includes first and second electrodes E1 and E2 that apply a current to the light-emitting structure layer EM1. The first electrode E1 is formed on the n-type semiconductor layer 13. The second electrode E2 is formed on the light-transmitting electrode layer 17.

The application of a voltage between the first and the second electrodes E1 and E2 emits the light from the light-emitting layer 14 in the light-emitting structure layer EM1. The light emitted from the light-emitting layer 14 repeats reflection between the first and the second reflecting mirrors 12 and 19, thus entering a resonance state (performing laser oscillation).

In this embodiment, the first reflecting mirror 12 has reflectance slightly lower than that of the second reflecting mirror 19. Therefore, a part of the light resonated between the first and the second reflecting mirrors 12 and 19 transmits through the first reflecting mirror 12 and the substrate 11 and is taken to the outside. Thus, the surface emitting laser 10 emits the light in the direction perpendicular to the substrate 11 and the light-emitting structure layer EM1.

The projection 15A of the p-type semiconductor layer 15 as a current confinement portion in the light-emitting structure layer EM1 defines a luminescence region in the light-emitting layer 14 and defines a central axis (luminescence central axis) CA of the resonator OC1 as an axis that passes through the center of the luminescence region. For example, the central axis CA of the resonator OC1 passes through the center of the projection 15A of the p-type semiconductor layer 15 and extends in the direction perpendicular to the p-type semiconductor layer 15 (light-emitting structure layer EM1).

The luminescence region of the light-emitting layer 14 is, for example, a region with a predetermined width from which a light with a predetermined intensity or more is emitted in the light-emitting layer 14, and the center of which is a luminescence center. For example, the luminescence region of the light-emitting layer 14 is a region to which the current having a predetermined density or more is injected in the light-emitting layer 14, and the center of which is a luminescence center. A straight line that passes through the luminescence center and is perpendicular to the substrate 11 is the central axis CA. The central axis CA is the straight line that extends along a direction of resonator length of the resonator OC1 constituted by the first and second reflecting mirrors 12 and 19. The central axis CA corresponds to an optical axis of a laser beam emitted from the surface emission laser 10.

Here, an exemplary configuration of each layer in the surface emitting laser 10 will be described. In this embodiment, the first reflecting mirror 12 is formed of 44 pairs of GaN layers and AlInN layers. The n-type semiconductor layer 13 has a layer thickness of 650 nm. The light-emitting layer 14 is formed of an active layer having a multiple quantum well structure in which 4 nm of InGaN layers and 5 nm of GaN layers are stacked three times. The second reflecting mirror 19 is formed of 10.5 pairs of $Nb_2O_5$ layers and $SiO_2$ layers.

The p-type semiconductor layer 15 has a layer thickness of 50 nm in the region of the projection 15A. The p-type semiconductor layer 15 has a layer thickness of 30 nm in a region other than the projection 15A. The projection 15A has an outer diameter of 8 μm. The insulating layer 16 has a layer thickness of 20 nm. The upper surface of the insulating layer 16 is formed to be arranged at the same height position as the upper end surface of the projection 15A of the p-type semiconductor layer 15. Note that these are merely one example.

Figure 3:
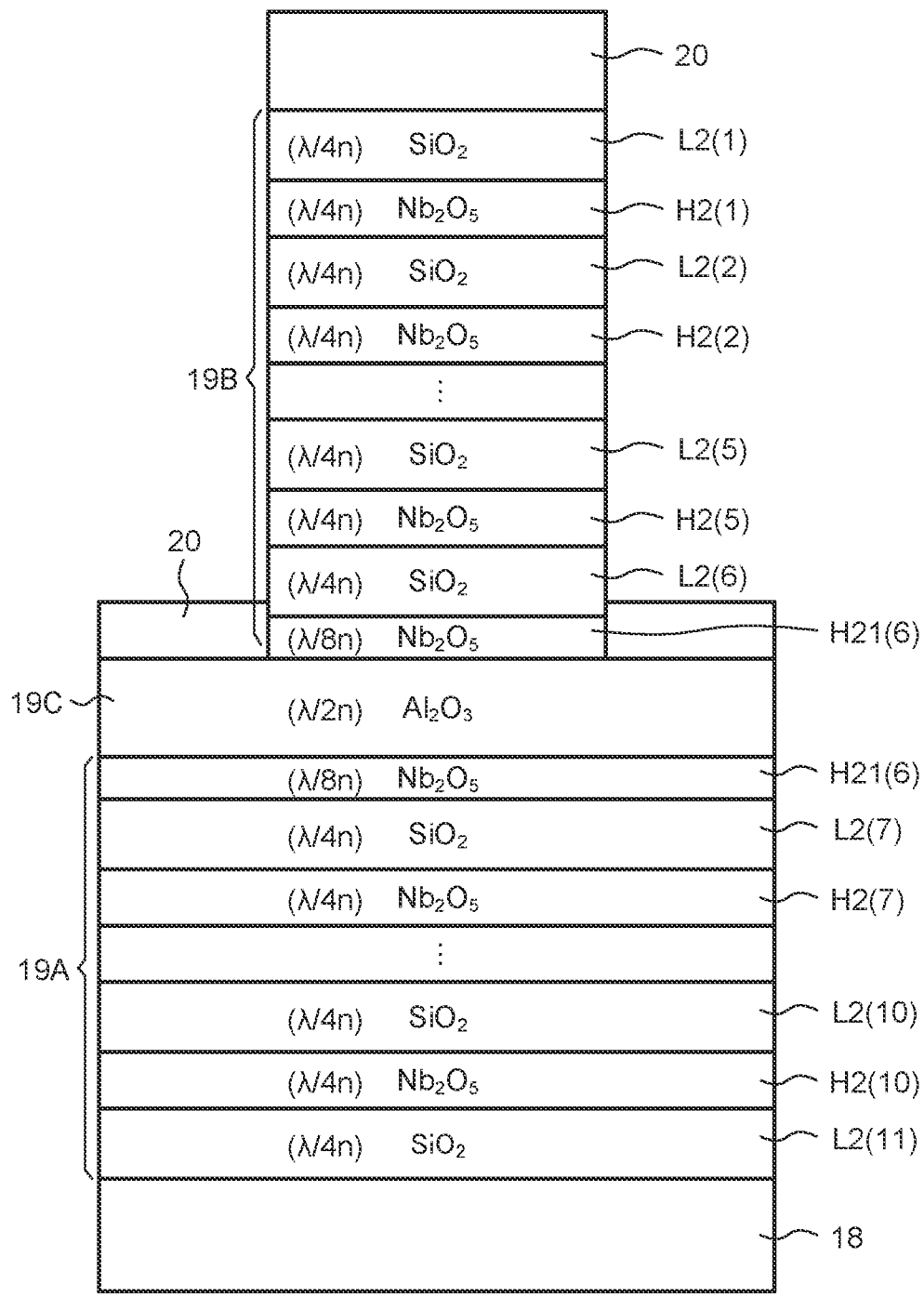
FIG. 3 is a side view of a second multilayer film reflecting mirror in the surface emission laser according to Embodiment 1.

FIG. 3 is a side view of the second reflecting mirror 19. Using FIG. 3, the detailed configuration of the second reflecting mirror 19 will be described. First, the first multilayer film 19A has a structure in which the low refractive index dielectric films L2 and the high refractive index dielectric films H2 are stacked on the insulating layer 18 in this order for four times, and the first thin film high refractive index dielectric film H21 is formed on the uppermost low refractive index dielectric film L2.

The second multilayer film 19B has a structure in which a second thin film high refractive index dielectric film H21 is formed on the intermediate dielectric film 19C, the low refractive index dielectric films L2 and the high refractive index dielectric films H2 are stacked thereon in this order for five times, and the low refractive index dielectric film L2 is formed on the uppermost high refractive index dielectric film H2.

As illustrated in FIG. 3, in this embodiment, the second reflecting mirror 19 is made of ten high refractive index dielectric films H2 and eleven low refractive index dielectric films L2. The first and second thin film high refractive index dielectric films H21 (6) have a configuration corresponding to when a layer thickness of the sixth high refractive index dielectric film H2 (6) from the uppermost surface side (the metallic film 20 side) is divided into half and two. The intermediate dielectric film 19C is formed between these first and second thin film high refractive index dielectric films H21 (6).

In this embodiment, each of low refractive index dielectric film L2 and each of high refractive index dielectric film H2 have film thickness corresponding to ¼ of a wavelength in each of dielectric film of the light emitted from the light-emitting layer 14. For example, when a refractive index of each dielectric film is assumed to be a refraction index n (in practice, different between the low refractive index dielectric film L2 and the high refractive index dielectric film H2) and an optical wavelength emitted from the light-emitting layer 14 is a wavelength λ, each dielectric film has a film thickness of λ/4n.

On the other hand, in this embodiment, the first and second thin film high refractive index dielectric films H21 (6) have a film thickness of λ/8n, the half thereof. In this embodiment, the intermediate dielectric film 19C has a film thickness of λ/2n.

Figure 4A:
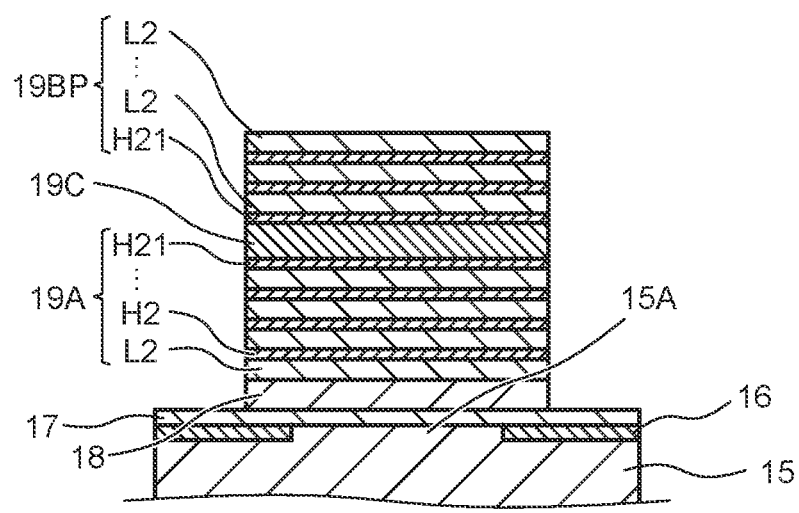
FIG. 4A is a drawing illustrating a method for manufacturing the surface emission laser according to Embodiment 1.
Figure 4B:
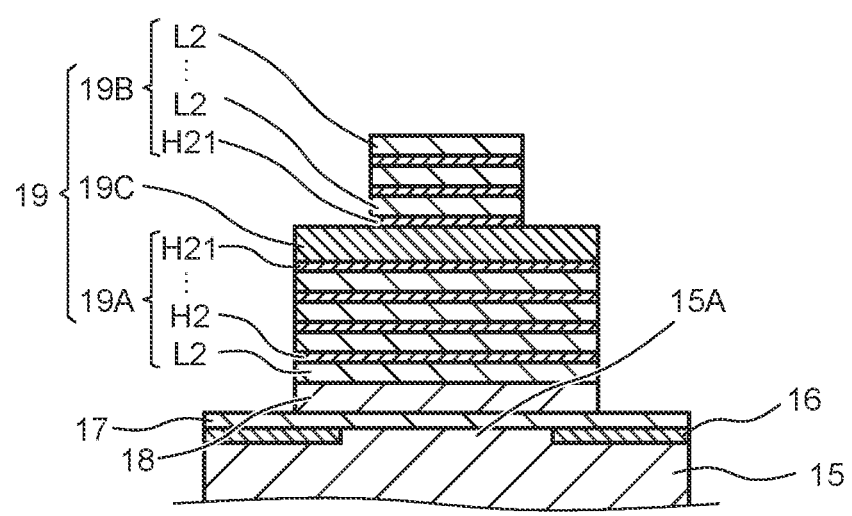
FIG. 4B a drawing illustrating the method for manufacturing the surface emission laser according to Embodiment 1.

FIG. 4A and FIG. 4B are drawings illustrating a part of a manufacturing process of the surface emission laser 10. Using FIG. 4A and FIG. 4B, the manufacturing process of the surface emission laser 10 will be described. First, FIG. 4A is a cross-sectional view illustrating a part of a semiconductor wafer in which the first and second multilayer films 19A and 19BP as multilayer films that serve as the second reflecting mirror 19 and the intermediate dielectric film 19C are formed.

First, on a semiconductor wafer that serves as the substrate 11, the first reflecting mirror 12, the light-emitting structure layer EM1, the insulating layer 16, the light-transmitting electrode layer 17, and the insulating layer 18 are formed. On the insulating layer 18, the low refractive index dielectric films L2 and the high refractive index dielectric films H2 are stacked for multiple times (five pairs in this embodiment) and the first thin film high refractive index dielectric film H21 is formed, and thus, the first multilayer film 19A is formed (step 1).

On the first multilayer film 19A, a dielectric film that serves as the intermediate dielectric film 19C and has an etching rate smaller than those of the high refractive index dielectric film H2 and the low refractive index dielectric film L2 is formed (step 2). On the intermediate dielectric film 19C, the second thin film high refractive index dielectric film H21 is formed, five pairs of the low refractive index dielectric films L2 and the high refractive index dielectric films H2 are stacked, and the low refractive index dielectric film L2 is formed, and thus, the second multilayer film 19BP are formed (step 3).

Next, FIG. 4B is a cross-sectional view illustrating a part of the semiconductor wafer after etching on the second multilayer film 19BP is performed. After the second multilayer film 19BP is formed, etching is performed on the second multilayer film 19BP, the second multilayer film 19BP is partially removed, and the intermediate dielectric film 19C is partially exposed. In this embodiment, dry etching is performed on the second multilayer film 19BP. This forms the second multilayer film 19B, and thus, the second reflecting mirror 19 is formed (step 4).

Here, the intermediate dielectric film 19C has an etching rate smaller than those of other dielectric films in the second reflecting mirror 19. Accordingly, when etching of the second multilayer film 19BP is performed, etching can be reliably stopped in the middle of the intermediate dielectric film 19C. That is, without, for example, the dielectric film at the bottom of the second multilayer film 19BP partly remaining in a part to be etched or a part of the first multilayer film 19A being etched, only the second multilayer film 19BP can be stably etched.

Accordingly, etching accuracy substantially stabilizes. Accordingly, the multilayer film can be processed such that the etching stops at a design depth position or a design film position. In this embodiment, the reflection characteristics as the second reflecting mirror 19 can be stably adjusted.

In this embodiment, after the second reflecting mirror 19 is formed, the metallic film 20 is formed on the intermediate dielectric film 19C and the second multilayer film 19B (step 5). Next, the first and second electrodes E1 and E2 are formed on the n-type semiconductor layer 13 and the p-type semiconductor layer 15 of the light-emitting structure layer EM1, respectively (step 6). Thus, the surface emission laser 10 can be manufactured.

Figure 5:
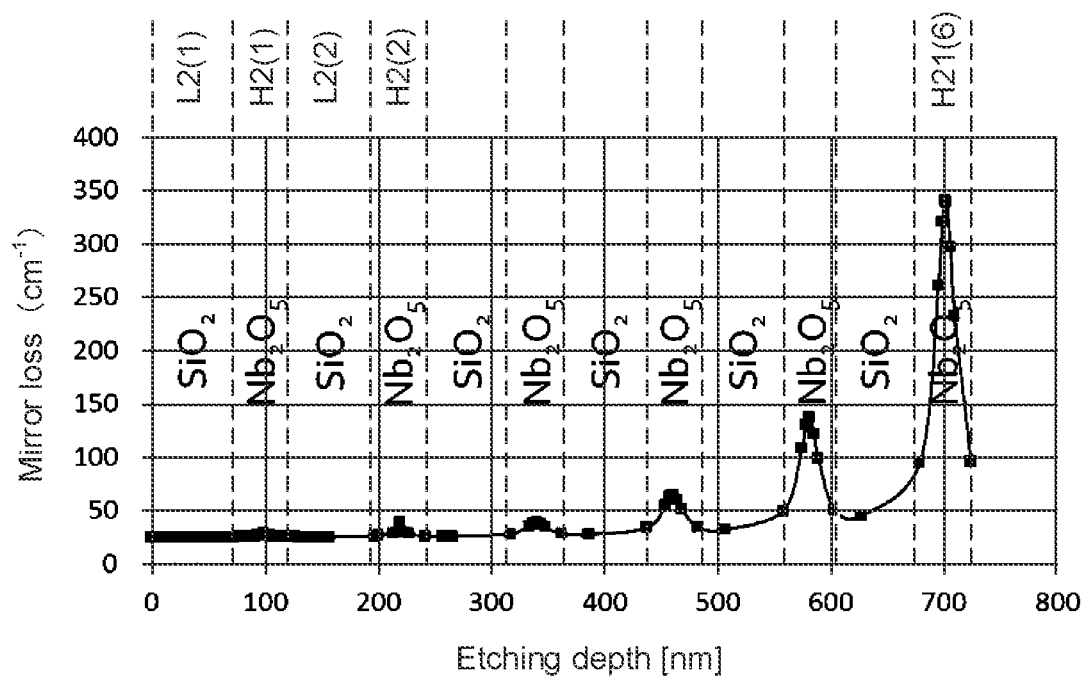
FIG. 5 is a drawing illustrating a degree of mirror loss in a first multilayer film of the second multilayer film reflecting mirror in the surface emission laser according to Embodiment 1.

FIG. 5 is a drawing illustrating a relation between an etching depth (position) based on the upper surface of the second multilayer film 19BP and the mirror loss in the second reflecting mirror 19. As illustrated in FIG. 5, it is seen that when etching is performed to the middle (for example, to the center in the film thickness direction) of the high refractive index dielectric film H2 at the sixth pair from the upper surface side, a significantly large mirror loss is caused compared with the case where etching is performed to other positions.

Accordingly, as in the second reflecting mirror 19 in this embodiment, the high refractive index dielectric film H2 at the sixth pair is divided into the first and second thin film high refractive index dielectric films H21 (6) and the intermediate dielectric film 19C is disposed between them so as to stop the etching in the middle to stably remove the second multilayer film 19B, thereby ensuring causing a large mirror loss at the removed part.

In this embodiment, the second multilayer film 19B is formed in the central portion of the first multilayer film 19A within a plane of the first multilayer film 19A. That is, in the outer periphery portion of the first multilayer film 19A, the second multilayer film 19B is removed. The first and second multilayer films 19A and 19B are disposed on the central axis CA of the resonator OC1. This stably ensures that the mirror loss in a region in the peripheral area of a region including the central axis CA is higher than for the mirror loss in the region including the central axis CA of the resonator OC1.

This leads to a stabilized transverse mode of the surface emission laser 10. Specifically, when a difference in mirror loss between the region on the central axis CA and the region in the peripheral area thereof is small, the oscillation mode of the surface emission laser 10 becomes unstable to sometimes perform the laser oscillation in a higher order mode. This is caused by a failure of stably forming the difference in mirror loss.

For example, as in this embodiment, when the dielectric multilayer film forms the second reflecting mirror 19, generally the difference in mirror loss on the central axis CA and in the peripheral area thereof is formed by a partial removal of the multilayer film. However, when the removal amount of the multilayer film becomes unstable, as illustrated in FIG. 5, the mirror loss is hardly caused depending on the depth position of the remained multilayer film. This leads the oscillation mode to become multi-mode or be unstable.

In contrast to this, in this embodiment, as in the intermediate dielectric film 19C, a film extremely slow in etching is formed at a preferable position in the multilayer film that serves as the second reflecting mirror 19, and the second multilayer film 19BP is partially removed by performing etching thereon. Accordingly, etching can be reliably stopped at a preferred position, and the second reflecting mirror 19 having preferred mirror characteristics can be formed. This can provide the surface emission laser 10 with a stable transverse mode.

In this embodiment, the case where the second reflecting mirror 19 is the DBR made of a dielectric material has been described. However, the second reflecting mirror 19 is only necessary to be a multilayer reflecting mirror and the material is not limited to the dielectric material.

The configurations of the first and second multilayer films 19A and 19B are also not limited to the above-described case. For example, the first multilayer film 19A is only necessary to have a structure in which low refractive index films (the low refractive index dielectric films L2) made of a low refractive index material (for example, the low refractive index dielectric material) and high refractive index films (the high refractive index dielectric films H2) made of a high refractive index material (for example, a high refractive index dielectric material) having a refractive index larger than the low refractive index material are alternately stacked.

The second multilayer film 19B is only necessary to be formed so as to partially cover the upper surface of the intermediate dielectric film 19C and have a structure in which the low refractive index films (the low refractive index dielectric films L2) made of the low refractive index material and the high refractive index films (the high refractive index dielectric films H2) made of the high refractive index material are alternately stacked.

The film thickness of the intermediate dielectric film 19C is not limited to the above. For example, the intermediate dielectric film 19C is only necessary to have a film thickness with which conditions as the DBR in the second reflecting mirror 19 is not broken, a film thickness with which the light emitted from the light-emitting layer 14 passes through without being inverted at the interface with other layers in the intermediate dielectric film 19C. For example, the intermediate dielectric film 19C is only necessary to have a film thickness based on ½ of the wavelength in the intermediate dielectric film 19C in the light emitted from the light-emitting layer 14, for example, a film thickness that fulfills $\lambda x/2n$ (x is a natural number).

For the position of the intermediate dielectric film 19C, it is only necessary that the intermediate dielectric film 19C is disposed at any preferred position in the second reflecting mirror 19. For example, when the metallic film 20 covers the upper surface of the second reflecting mirror 19, it is preferred to be disposed between the first and second thin film high refractive index films H21 disposed in the respective first and second multilayer films 19A and 19B.

More specifically, for example, it is preferred that the low refractive index dielectric film L2 is disposed on the side closest to the substrate 11 of the first multilayer film 19A. It is preferred that the thin film high refractive index dielectric film H21 that is made of the high refractive index material and has a film thickness smaller than that of the high refractive index dielectric film H2 is disposed on the side closest to the intermediate dielectric film 19C of the first multilayer film 19A. It is preferred that the low refractive index dielectric film L2 is disposed on the side closest to the upper surface of the second multilayer film 19B. It is preferred that the thin film high refractive index dielectric film H21 that is made of the high refractive index material and has a film thickness smaller than that of the high refractive index dielectric film H2 is disposed on the side closest to the intermediate dielectric film 19C of the second multilayer film 19B.

For example, as illustrated in FIG. 3, the second multilayer film 19B is preferred to have five each of low refractive index dielectric film L2 and high refractive index dielectric film H2, and the thin film high refractive index film H21. It is preferred that the low refractive index dielectric films L2 and the high refractive index dielectric films H2 in the first and second multilayer films 19A and 19B have a film thickness based on ¼ of the wavelength in each of low refractive index dielectric film L2 and high refractive index dielectric film H2 of the light emitted from the light-emitting layer 14 (for example, the film thickness fulfilling $\lambda x/4n$ (x is a natural number)). It is preferred that the thin film high refractive index films H21 have a film thickness based on ⅛ of the wavelength in the thin film high refractive index film of the light emitted from the light-emitting layer 14 (for example, the film thickness fulfilling $\lambda x/8n$ (x is a natural number)).

This embodiment has described the case where the intermediate dielectric film 19C has the etching rate smaller than those of the high refractive index dielectric film H2 and the low refractive index dielectric films L2. However, the intermediate dielectric film 19C is only necessary to be a translucent film having a film thickness enough for reliably stopping the etching, for example, a film thickness described above. The intermediate dielectric film 19C is not limited to the case where the film has an etching rate smaller than those of the other layers. The intermediate dielectric film 19C is only necessary to cover the upper surface of the first multilayer film 19A.

As described above, in this embodiment, the surface emission laser 10 has the substrate 11, the first multilayer film reflecting mirror 12 formed on the substrate 11, the light-emitting structure layer EM1 that is formed on the first multilayer film reflecting mirror 12 and includes the light-emitting layer 14, the second multilayer film reflecting mirror 19 that is formed on the light-emitting structure layer EM1 and constitutes the resonator OC1 between the first multilayer film reflecting mirror 12 and the second multilayer film reflecting mirror 19.

The second multilayer film reflecting mirror 19 includes the first multilayer film 19A in which the low refractive index films L2 made of the low refractive index material and the high refractive index films H2 made of the high refractive index material having the refractive index larger than that of the low refractive index material are alternately stacked, the intermediate dielectric film 19C that covers the upper surface of the first multilayer film 19A and has translucency to the light emitted from the light-emitting layer 14, and the second multilayer film 19B that is formed so as to partly cover the upper surface of the intermediate dielectric film 19C and in which the low refractive index films L2 made of the low refractive index material and the high refractive index films H2 made of the high refractive index material are alternately stacked.

The intermediate dielectric film 19C has a film thickness based on ½ of the wavelength in the intermediate dielectric film 19C of the light emitted from the light-emitting layer 14. Accordingly, the surface emission laser 10 (the vertical cavity surface emitting device) that can emit the light in a stable transverse mode can be provided.

Embodiment 2

Figure 6:
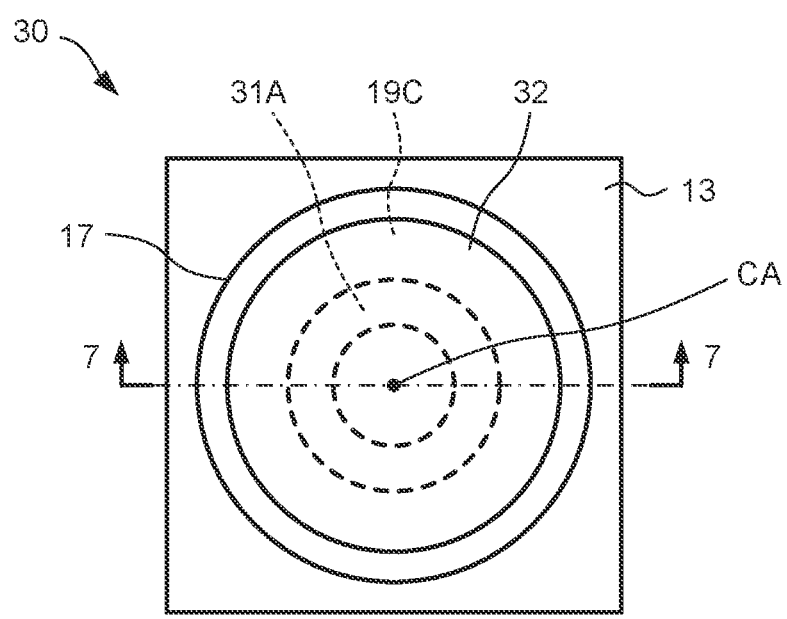
FIG. 6 is a top view of a surface emission laser according to Embodiment 2.
Figure 7:
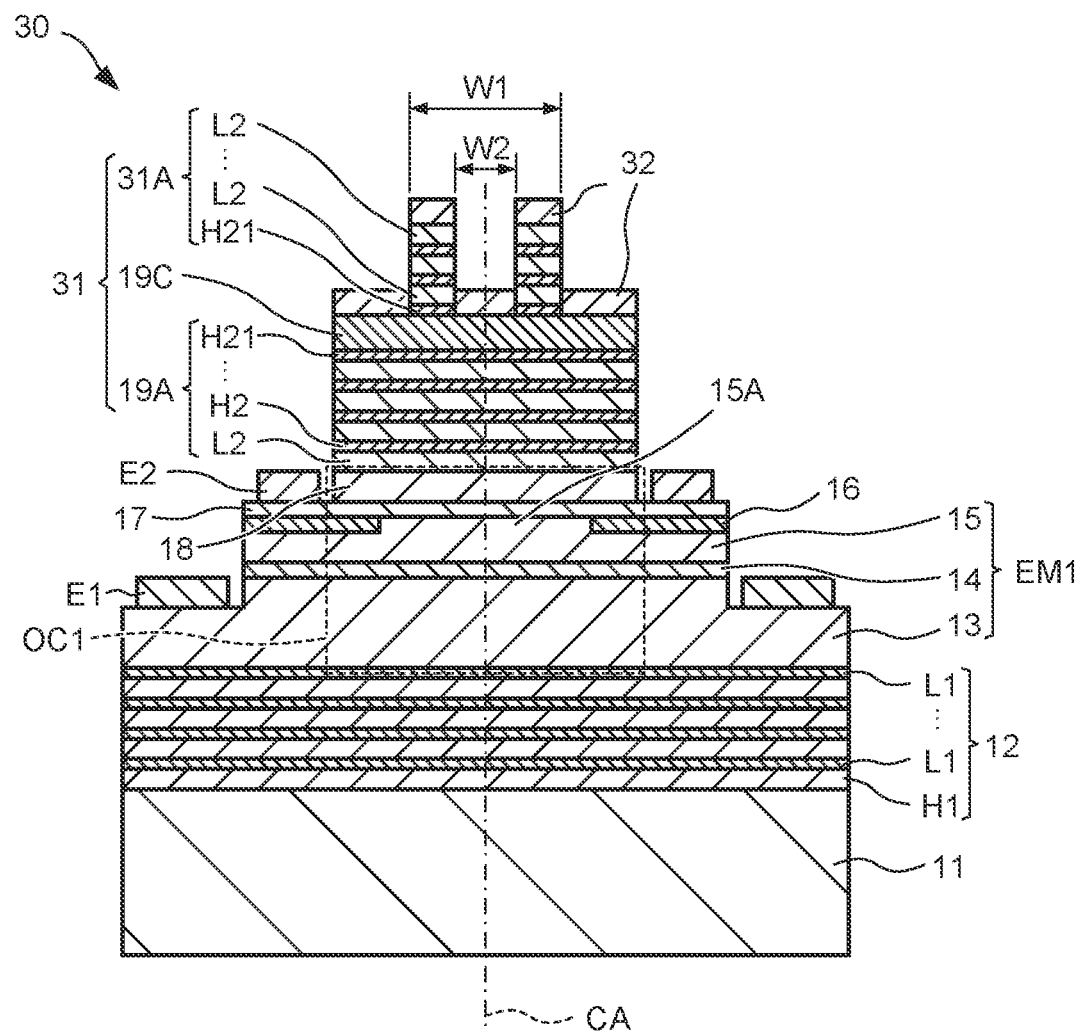
FIG. 7 is a cross-sectional view of the surface emission laser according to Embodiment 2.

FIG. 6 is a top view of a surface emission laser 30 according to Embodiment 2. FIG. 7 is a cross-sectional view of the surface emission laser 30. FIG. 7 is a cross-sectional view taken along the line 7-7 in FIG. 6. The surface emission laser 30 has a configuration similar to that of the surface emission laser 10 except for configurations of a second reflecting mirror 31 and a metallic film 32.

In this embodiment, the second reflecting mirror 31 has a second multilayer film 31A formed into a ring shape on the upper surface of the intermediate dielectric film 19C instead of the second reflecting mirror 19B of the second reflecting mirror 19. In this embodiment, the second multilayer film 31A has the high refractive index dielectric films H2 and the low refractive index dielectric films L2 formed into a circular ring shape.

The metallic film 32 is formed on the intermediate dielectric film 19C and the second multilayer film 31A, which include the upper surface of the intermediate dielectric film 31A exposed from the second multilayer film 31 on the inner side of the second multilayer film 31.

In this embodiment, the second multilayer film 31A has the second thin film high refractive index dielectric film H21 at the interface with the intermediate dielectric film 19C similarly to the second multilayer film 19B. The intermediate dielectric film 19C is formed between the first and second thin film high refractive index dielectric films H21.

This embodiment can provide the surface emission laser 30 that performs a laser oscillation in a further stable transverse mode. Specifically, in this embodiment, even in a region on the central axis CA of the resonator OC1, a high mirror loss region is formed. That is, within the resonator OC1, a region with a high reflection property is formed into a ring shape about the central axis CA.

This can cause the laser oscillation to be performed while confining the light in the ring-shaped region. Accordingly, for example, adjusting the width of the ring-shaped region ensure developing a plurality of eigenmodes in the ring-shaped region.

For example, the second multilayer film 31A has an outer diameter W1 of 7.5 μm and an inner diameter W2 of 2.5 μm. For example, forming such a ring-shaped second multilayer film 31A ensures generating a near-field pattern having intensity peaks at a plurality of positions. The lights having the near-field pattern with such a pattern are emitted while being narrowed as a whole by interfering with one another. That is, for example, a stable unimodal laser beam can be emitted.

Thus, this embodiment ensures forming the second reflecting mirror 31 having the second multilayer film 31A in a ring shape using the intermediate dielectric film 19C. Accordingly, a region with small mirror loss can be stably formed into a ring shape, and in view of this, the surface emission laser 30 with a stable transverse mode can be provided.

Embodiment 3

Figure 8:
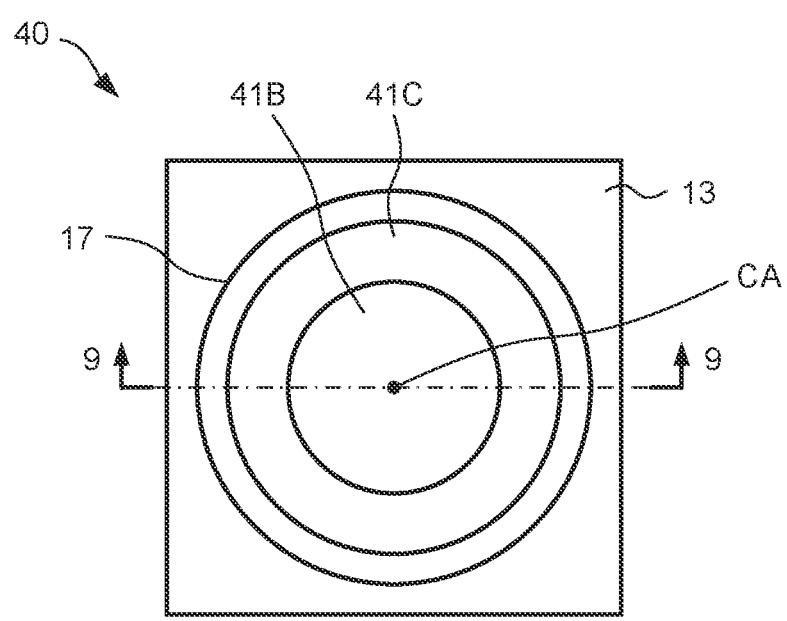
FIG. 8 is a top view of a surface emission laser according to Embodiment 3.
Figure 9:
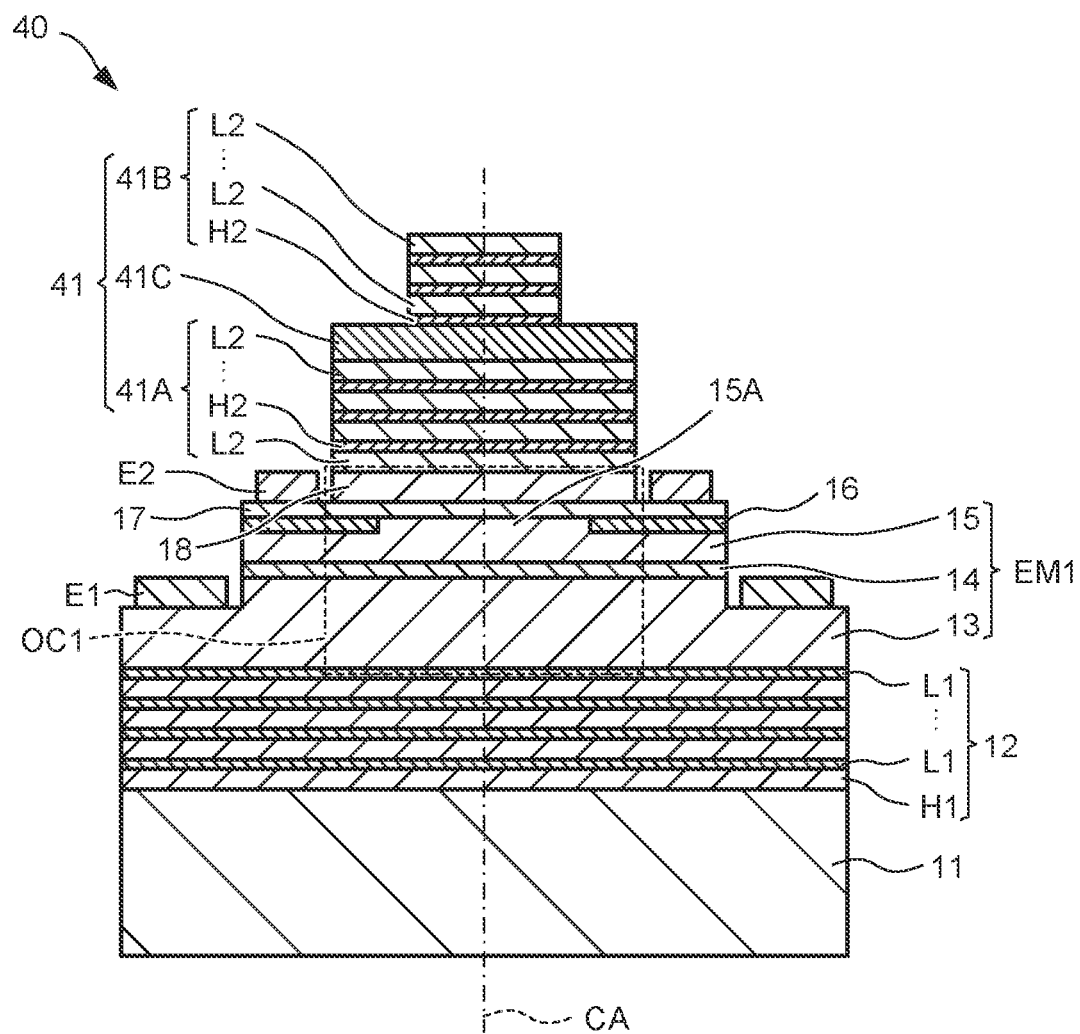
FIG. 9 is a cross-sectional view of the surface emitting laser according to Embodiment 3.

FIG. 8 is a top view of a surface emission laser 40 according to Embodiment 3. FIG. 9 is a cross-sectional view of the surface emission laser 40. The surface emission laser 40 has a configuration similar to that of the surface emission laser 10 except for a configuration of a second reflecting mirror 41. In the surface emission laser 40, the second reflecting mirror 41 is optically exposed in the upper surface.

In this embodiment, the second reflecting mirror 41 has a first multilayer film 41A having the low refractive index layer L2 on the uppermost surface, an intermediate dielectric film 41C formed on the low refractive index layer L2 of the first multilayer film 41A, a second multilayer film 41B formed on the intermediate dielectric film 41C having a high refractive index layer H2 at an interface with the intermediate dielectric film 41C. Upper surfaces of the second multilayer film 41B and the intermediate dielectric film 41C have no metallic film and are optically exposed.

Figure 10:
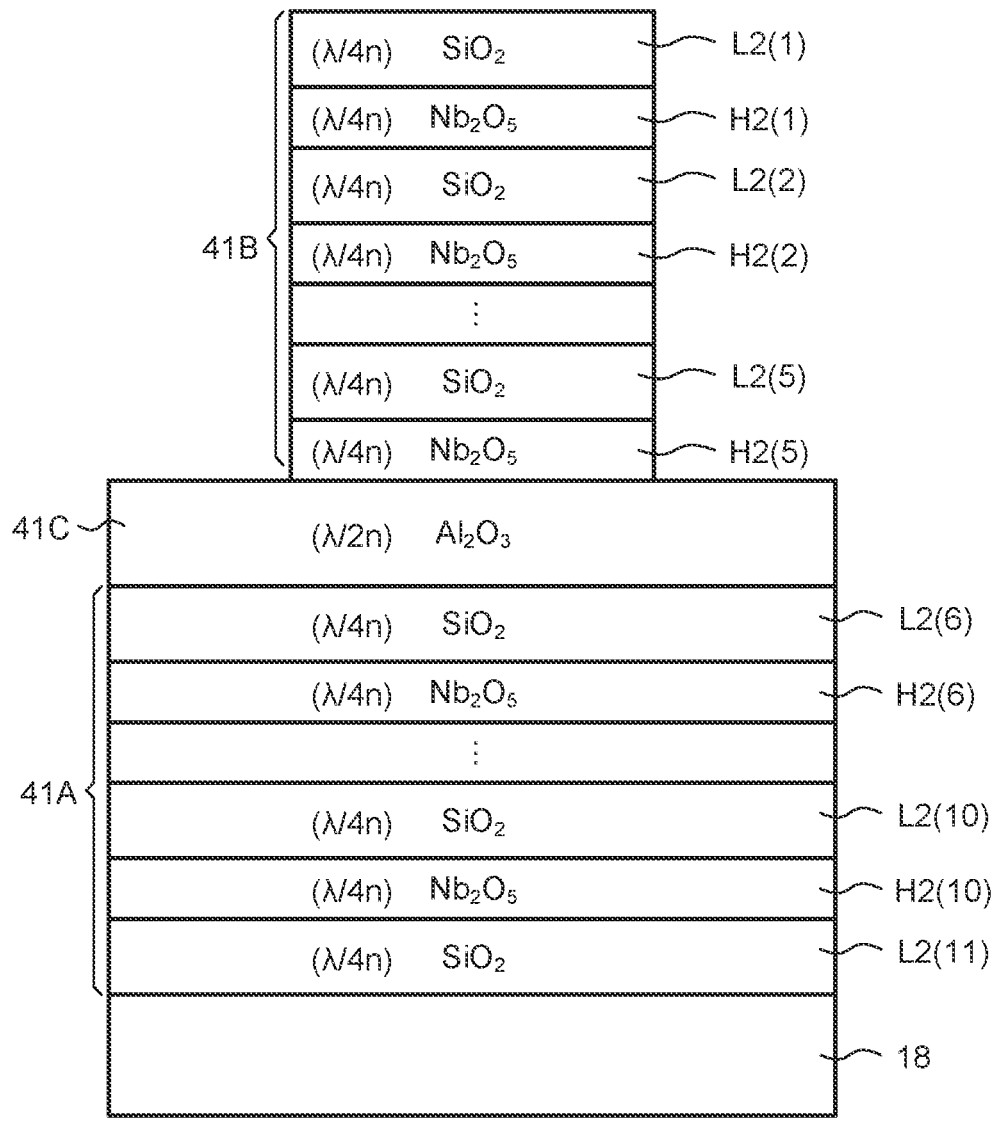
FIG. 10 is a side view of a second multilayer film reflecting mirror in the surface emission laser according to Embodiment 3.

FIG. 10 is a side view of the second reflecting mirror 41. In this embodiment, the first multilayer film 41A has a structure in which five pairs of the low refractive index dielectric films L2 and the high refractive index dielectric films H2, and the fifth low refractive index dielectric film L2 are stacked. The second multilayer film 41B has a structure in which five pairs of the high refractive index dielectric dielectric films H2 and the low refractive index dielectric films L2 are stacked.

As illustrated in FIG. 10, in this embodiment, the intermediate dielectric film 41C is formed between the high refractive index dielectric film H2 (5) at the fifth pair and the low refractive index dielectric film L2 (6) at the sixth pair from the upper surface of the second multilayer film 41B in the second reflecting mirror 41.

In this embodiment, the upper surface of the second reflecting mirror 41 is optically exposed, which is different from the case where the metallic film is disposed in light reflection conditions on the end surface. In this case, disposing the intermediate dielectric film 41C at the position as described above and etching it ensures causing a large mirror loss. Accordingly, for example, a unimodal laser beam can be stably emitted.

Note that, in this embodiment, for example, as illustrated in Embodiment 2, the second multilayer film 41B may be formed into a ring shape (a tubular shape). In this case, similarly to Embodiment 2, a laser beam can be generated in a further stable transverse mode. For example, when the second multilayer film 41B is formed into a ring shape, examples of its size include the outer diameter W1 of 9 μm and the inner diameter W2 of 3 μm.

Also in this embodiment, the configurations of the first and second multilayer films 41A and 41B, and the configuration of the intermediate dielectric film 41C are also not limited to the above-described case. For example, when the upper surface of the second reflecting mirror 41 is optically exposed, it is preferred that the low refractive index dielectric film L2 is disposed on the side closest to the substrate 11 of the first multilayer film 41A and the low refractive index dielectric film L2 is disposed on the side closest to the intermediate dielectric film 41C of the first multilayer film 41A. It is preferred that the low refractive index dielectric film L2 is disposed on the side closest to the upper surface of the second multilayer film 41B, and the high refractive index dielectric film H2 is disposed on the side closest to the intermediate dielectric film 41C of the second multilayer film 41B.

For example, as illustrated in FIG. 10, it is preferred that the second multilayer film 41B has five each of low refractive index dielectric film L2 and high refractive index dielectric film H2. It is preferred that and the low refractive index dielectric films L2 and the high refractive index dielectric films H2 have a film thickness (for example, a film thickness that fulfills $\lambda x/4n$ (x is a natural number)) based on ¼ of the wavelengths in each of low refractive index dielectric film L2 and high refractive index dielectric film H2 of the light emitted from the light-emitting layer 14.

As the above-described various kinds of embodiments, forming a layer having an etching rate smaller than those of other layers inside the second reflecting mirrors 19, 31, and 41 ensures forming a reflecting mirror with a preferable reflection property, thereby ensuring providing, for example, the surface emission laser 10, 30, and 40 (the vertical cavity surface emitting device) with a stable transverse mode.

DESCRIPTION OF REFERENCE SIGNS 10, 30, 40 Surface emission laser (vertical cavity surface emitting device)
EM1 Light-emitting structure layer
14 Light-emitting layer
19, 31, 41 Second multilayer film reflecting mirror

The invention claimed is:

1. A vertical cavity surface emitting device comprising:
a substrate;
a first multilayer film reflecting mirror formed on the substrate;
a light-emitting structure layer formed on the first multilayer film reflecting mirror, the light-emitting structure layer including a light-emitting layer; and
a second multilayer film reflecting mirror formed on the light-emitting structure layer, the second multilayer film reflecting mirror constituting a resonator between the first multilayer film reflecting mirror and the second multilayer film reflecting mirror,
wherein:
the second multilayer film reflecting mirror includes a first multilayer film, an intermediate film, and a second multilayer film, the first multilayer film having low refractive index films made of a low refractive index material and high refractive index films made of a high refractive index material having a refractive index higher than a refractive index of the low refractive index material, the low refractive index films and the high refractive index films being alternately stacked, the intermediate film covering an upper surface of the first multilayer film, the intermediate film having a translucency to a light emitted from the light-emitting layer, the second multilayer film being formed to partially cover an upper surface of the intermediate film, the second multilayer film having the low refractive index films made of the low refractive index material and the high refractive index films made of the high refractive index material, and the low refractive index films and the high refractive index films being alternately stacked,
the intermediate film has a film thickness based on ½ of a wavelength inside the intermediate film of a light emitted from the light-emitting layer,
an upper surface of the second multilayer film and an area on the upper surface of the intermediate film where the second multilayer film is not formed are optically exposed, and
the high refractive index films, the low refractive index films, and the intermediate film are made of a dielectric film.

2. The vertical cavity surface emitting device according to claim 1, wherein:
the first multilayer film has a side closest to the substrate on which a low refractive index film is disposed and the first multilayer film has a side closest to the intermediate film on which a first thin film high refractive index film made of the high refractive index material is disposed, the first thin film high refractive index film having a film thickness smaller than a film thickness of the high refractive index film,
the second multilayer film has a side closest to an upper surface thereof on which a low refractive index film is disposed and the second multilayer film has a side closest to the intermediate film on which a second thin film high refractive index film made of the high refractive index material is disposed, the second thin film high refractive index film having a film thickness smaller than a film thickness of the high refractive index film, and
the second multilayer film and the intermediate film have upper surfaces covered with a metallic film.

3. The vertical cavity surface emitting device according to claim 2, wherein:
the second multilayer film has five each of the low refractive index films and the high refractive index films, and the thin film high refractive index film,
the low refractive index films and the high refractive index films in the first and second multilayer films have a film thickness based on ¼ of a wavelength in each of the low refractive index films and the high refractive index films of the light emitted from the light-emitting layer, and
the first and second thin film high refractive index films in the first and second multilayer films have a film thickness based on ⅛ of a wavelength inside the first and second thin film high refractive index films of the light emitted from the light-emitting layer.

4. The vertical cavity surface emitting device according to claim 1, wherein:
the first multilayer film has a side closest to the substrate on which the low refractive index film is disposed, and the first multilayer film has a side closest to the intermediate film side on which the low refractive index film is disposed, and
the second multilayer film has a side closest to an upper surface thereof on which the low refractive index film is disposed, and the second multilayer film has a side closest to the intermediate film on which the high refractive index film is disposed.

5. The vertical cavity surface emitting device according to claim 4, wherein:
the second multilayer film has five each of the low refractive index films and the high refractive index films, and
the low refractive index films and the high refractive index films in the first and second multilayer films have a film thickness based on ¼ of a wavelength in each of the low refractive index films and the high refractive index films of the light emitted from the light-emitting layer.

6. The vertical cavity surface emitting device according to claim 1, wherein the second multilayer film is formed into a ring shape on the upper surface of the intermediate film.

7. The vertical cavity surface emitting device according to claim 1, wherein the intermediate film has an etching rate smaller than etching rates of the low refractive index films and the high refractive index films of the second multilayer film.

8. The vertical cavity surface emitting device according to claim 1, wherein the intermediate film is made of an $Al_2O_3$ film or an AlN film.

9. The vertical cavity surface emitting device according to claim 1, wherein a mirror loss in a region including the area on the upper surface of the intermediate film where second multilayer film is not formed is larger than a mirror loss in a region including the upper surface of the second multilayer film.

10. The vertical cavity surface emitting device according to claim 1, wherein:
the light-emitting structure layer has a p-type semiconductor layer on the light-emitting layer,
the p-type semiconductor layer has a projection on an upper surface of the p-type semiconductor layer, and an insulating layer is formed on the upper surface of the p-type semiconductor layer except the projection.

* * * * *